(12) United States Patent
Maliakal (10) Patent No.: US 8,012,564 B2
(45) Date of Patent: Sep. 6, 2011

(54) NANOPARTICLE DISPERSIONS WITH LOW AGGREGATION LEVELS

(75) Inventor: Ashok J. Maliakal, Westfield, NJ (US)

(73) Assignee: Alcatel Lucent, Paris (FR)

( * ) Notice: Subject to any disclaimer, the term of this patent is extended or adjusted under 35 U.S.C. 154(b) by 1416 days.

(21) Appl. No.: 11/459,584

(22) Filed: Jul. 24, 2006

(65) Prior Publication Data

US 2008/0017848 A1    Jan. 24, 2008

(51) Int. Cl.
*B32B 5/16* (2006.01)
(52) U.S. Cl. ......... 428/144; 428/407; 428/143; 428/148
(58) Field of Classification Search .................. 428/407, 428/143, 144, 148
See application file for complete search history.

(56) References Cited

U.S. PATENT DOCUMENTS

| 6,586,791 | B1 * | 7/2003 | Lee et al. ................. | 257/295 |
| 2004/0222412 | A1 * | 11/2004 | Bai et al. ................. | 257/40 |
| 2007/0284570 | A1 | 12/2007 | Sydorneko | |

OTHER PUBLICATIONS

Mitsubishi International Corporation, "Silane Coupling Agents", Accessed Dec. 13, 2009 from www.micchem.com/products/SilaneCouplingAgents.htm.*
Mitsubishi International Corp., "Silane Coupling Agents" (Silane Coupling Agents 2), Archived May 9, 2003 at web.archive.org/web/20030509124953/http://www.micchem.com/products/SilaneCouplingAgents.htm, retrieved on Jun. 19, 2010.*
Dow Chemical Company, "A Guide to Silane Solutions: Silane Coupling Agents", Product Literature, 2009 (Accessed Mar. 10, 2010 from https://www.xiameter.com/en/ExploreSilicones/Documents/Silane%20Chemistry-2a-95-719-01-F2.pdf.

* cited by examiner

*Primary Examiner* — William P Watkins, III
(74) *Attorney, Agent, or Firm* — Hitt Gaines, PC

(57) ABSTRACT

An apparatus comprising a substrate having a surface and a dielectric layer comprising a distribution of particles. The layer is located over the surface and has a dielectric constant of seven or more. Each particle has a particle core and a polymer shell that is chemically bonded thereto and located around the associated particle core. Each particle core includes a material having a dielectric constant of about fifteen or more. Aggregates of the particle cores having diameters of about 0.5 microns or more are substantially absent from the layer.

16 Claims, 6 Drawing Sheets

NANOPARTICLE DISPERSIONS WITH LOW AGGREGATION LEVELS

TECHNICAL FIELD OF THE INVENTION

The present invention is directed, in general, to organic-inorganic composite materials with high dielectric constants.

BACKGROUND OF THE INVENTION

This section introduces aspects that may be helpful to facilitating a better understanding of the inventions. Accordingly, the statements of this section are to be read in this light. The statements of this section are not to be understood as admissions about what is in the prior art or what is not in the prior art.

Organic semiconducting devices are the subject of intense research because of their potential for low-cost, flexible electronic devices. They have been employed in organic light-emitting diodes (oLEDs) and organic field-effect transistors (oFETs), and in circuits integrating multiple devices. Fabrication techniques such as ink jet printing will help reduce the cost of fabrication of these devices and integrated circuits using them.

It is sometimes desirable to employ organic films with relatively high dielectric constant (about 8 or greater) in organic semiconducting devices. For example, the voltage required to turn on a transistor is lower when a gate dielectric of the transistor has a higher dielectric constant than when the gate dielectric has a lower dielectric constant.

SUMMARY OF THE INVENTION

One method of producing organic films with a relatively high dielectric constant involves forming a composite of an inorganic particle and a polymer. However, in some cases phase separation between the organic and inorganic phases of the composite can lead to a nonuniform distribution of the constituents of the composite. Such nonuniformity may be detrimental to the electronic properties of a device employing the composite. Some embodiments provide an improved method of forming organic dielectric compositions that are not subject to the aforementioned deficiencies.

To address the above-discussed deficiencies of the prior art, the present invention provides, in one aspect, an apparatus having a substrate with a surface and a dielectric layer comprising a distribution of particles. The layer is located over the surface and has a dielectric constant of seven or more. Each particle has a particle core and a polymer shell that is chemically bonded to and located around the associated particle core. Each particle core includes a material having a dielectric constant of about fifteen or more. Aggregates of the particle cores having diameters of about 0.5 microns or more are substantially absent from the layer.

Another embodiment is a composition. The composition includes an initiator molecule including a chain having about twenty or fewer carbon atoms. The chain is terminated at one end by a phosphonate moiety, and is terminated at another end by a halogenated alkyl derivative of an aryl moiety.

Another embodiment is a composition. The composition includes an inorganic particle core formed of a material having a dielectric constant of about fifteen or more. An initiator molecule is chemically bonded to the inorganic particle core. The initiator molecule includes a chain having about twenty or fewer carbon atoms, a phosphorous atom chemically bonded to an end of said chain, and a halogenated alkyl derivative of an aryl moiety terminating another end of said chain.

Another embodiment is a method of forming a dielectric layer. The method includes providing a suspension of particles in a solvent. Each of the particles comprises an inorganic core having a dielectric constant of about fifteen or more. A polymerization initiator is chemically bonded to the inorganic core, and a plurality of monomer units is chemically bonded to the polymerization initiator. A layer of the suspension is formed on a surface of a substrate.

BRIEF DESCRIPTION OF THE DRAWINGS

For a more complete understanding of the invention, reference is now made to the following descriptions in which.

DETAILED DESCRIPTION

Figure 1:
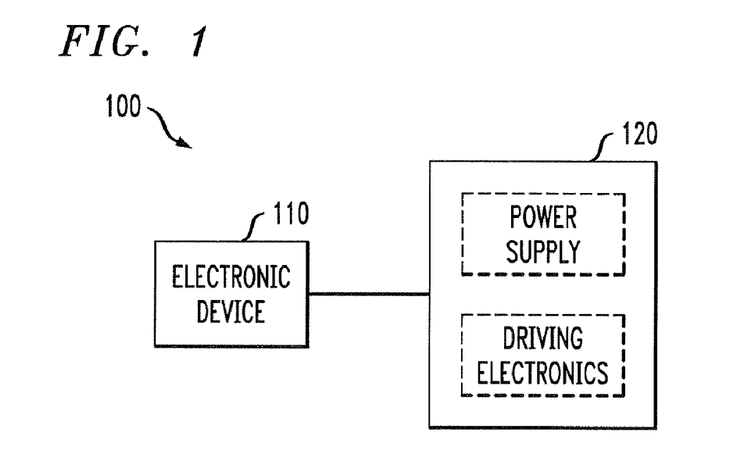
FIG. 1 illustrates an apparatus.

One embodiment is an apparatus. FIG. 1 illustrates an apparatus 100 including an electronic device 110 and supporting electronics 120. The supporting electronics 120 includes a power supply and driving electronics. In some cases, the electronic device 110 may be, e.g., an organic FET (oFET).

Figure 2:
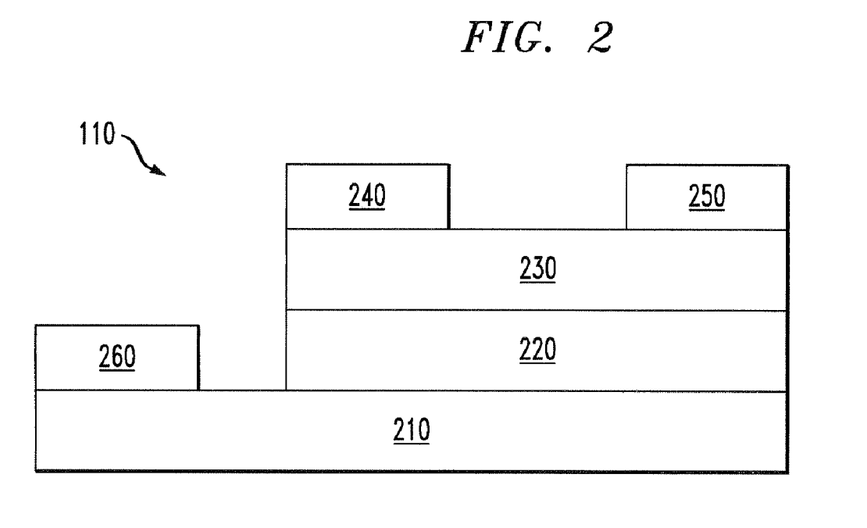
FIG. 2 illustrates an oFET.

FIG. 2 illustrates an example of an electronic device 110. The device 110 illustrated is a bottom-gate organic FET (oFET), though other devices are contemplated, such as capacitors, e.g. In the illustrated architecture, the bottom gate includes a substrate 210 having sufficient conductivity to act as a gate electrode. In some cases, the substrate 210 is a $p^{++}$-silicon wafer, but may be any other suitable substrate.

A dielectric layer 220 serves as a gate dielectric, insulating a channel layer 230 from the substrate 210. The dielectric layer 220 is a composition as described below that includes a distribution of particles, and has a dielectric constant of seven or more. The channel layer 230 may be a suitable organic semiconductor. In one aspect, the channel layer 230 is a semiconducting polymer or small molecule of presently known or future discovered composition. Those skilled in the pertinent art are familiar with such materials and methods of their processing.

A source electrode 240, drain electrode 250 and gate electrode 260 provide electrical connectivity to the terminals of the oFET 200. Those skilled in the pertinent art are familiar with methods of forming such electrodes and making electric connection thereto.

Figure 3:
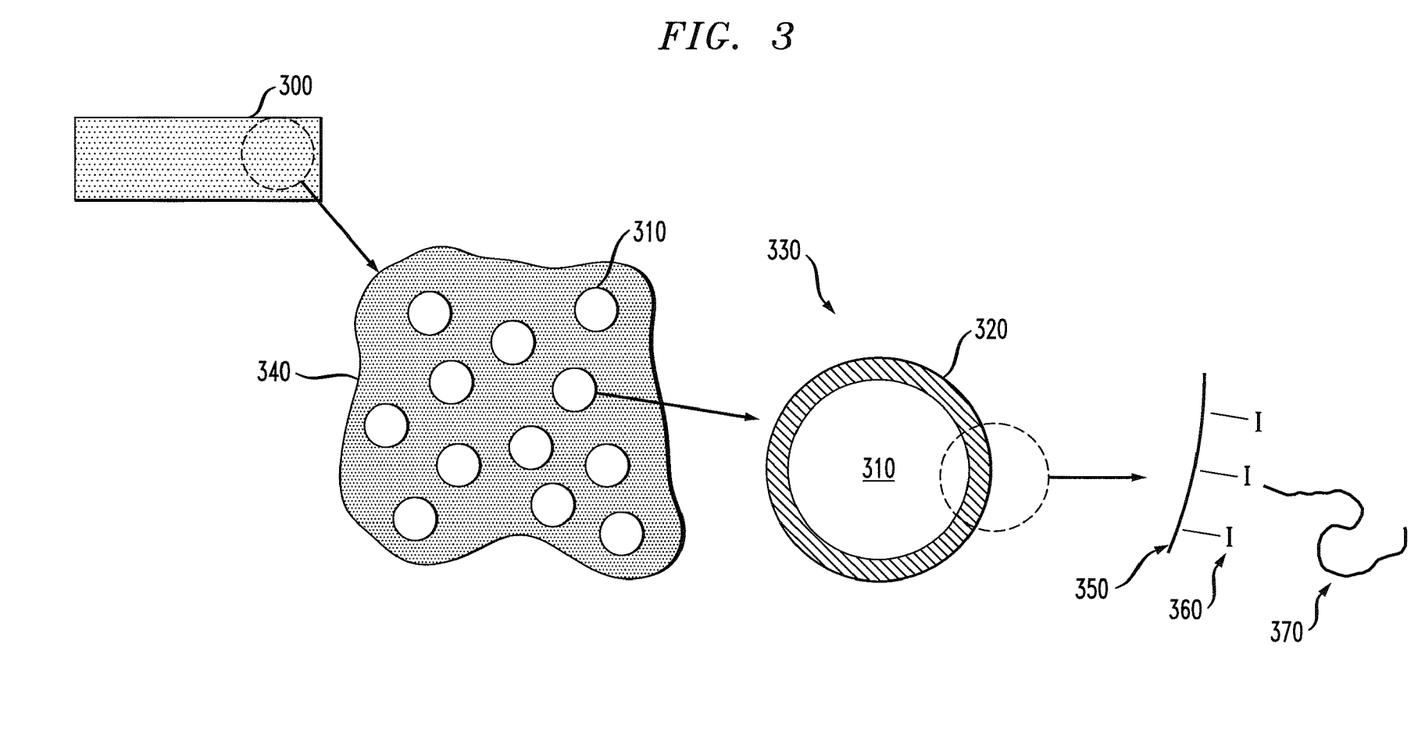
FIG. 3 illustrates a composition including particles, each particle having a particle core and having a polymer shell.

FIG. 3 illustrates a composition 300 that may be employed as the dielectric layer 220. A method of synthesizing the composition 300 is described below. The composition 300 includes particle cores 310, each having a polymer shell 320 chemically bonded to and located around the associated particle core 310. The particle core 310 and polymer shell 320 together form a particle 330.

The particle core 310 may have a dielectric constant of fifteen or more. (As used herein, "dielectric constant," abbreviated "k," refers to the ratio of the dielectric permittivity of a material to that of free space.) In some cases, the dielectric constant of the particle core 310 may be 30 or more, and may even be 60 or more.

Aggregates of the particle cores 310, the aggregates having diameters of about 0.5 microns or more, are substantially absent from in the composition 300. When present, such aggregates may include fewer than three individual particle cores 310.

In one aspect, the particle core 310 is an inorganic material. Examples of materials having a dielectric constant in the recited range include titania ($TiO_2$), for which k may be about 30 or more, and perovskites such as $BaTiO_3$, for which k may be greater than about 100 or more.

It is thought that when formed into the composition 300, the polymer shells 320 entangle to form a polymer medium 340 of the composition 300. The dielectric constant of the composition 300 is expected to be approximately the weighted average of the dielectric constants of the polymer shell 320 and the particle core 310 in proportion to the volume fraction of each.

In an embodiment, the polymer shell 320 is chemically bonded to a surface 350 of the particle core 310 using a polymerization initiator 360. An embodiment of the polymerization initiator 360 is described below. A plurality of monomer units may then be chemically bonded to the polymerization initiator 360 to form a polymer chain 370.

Figure 4:
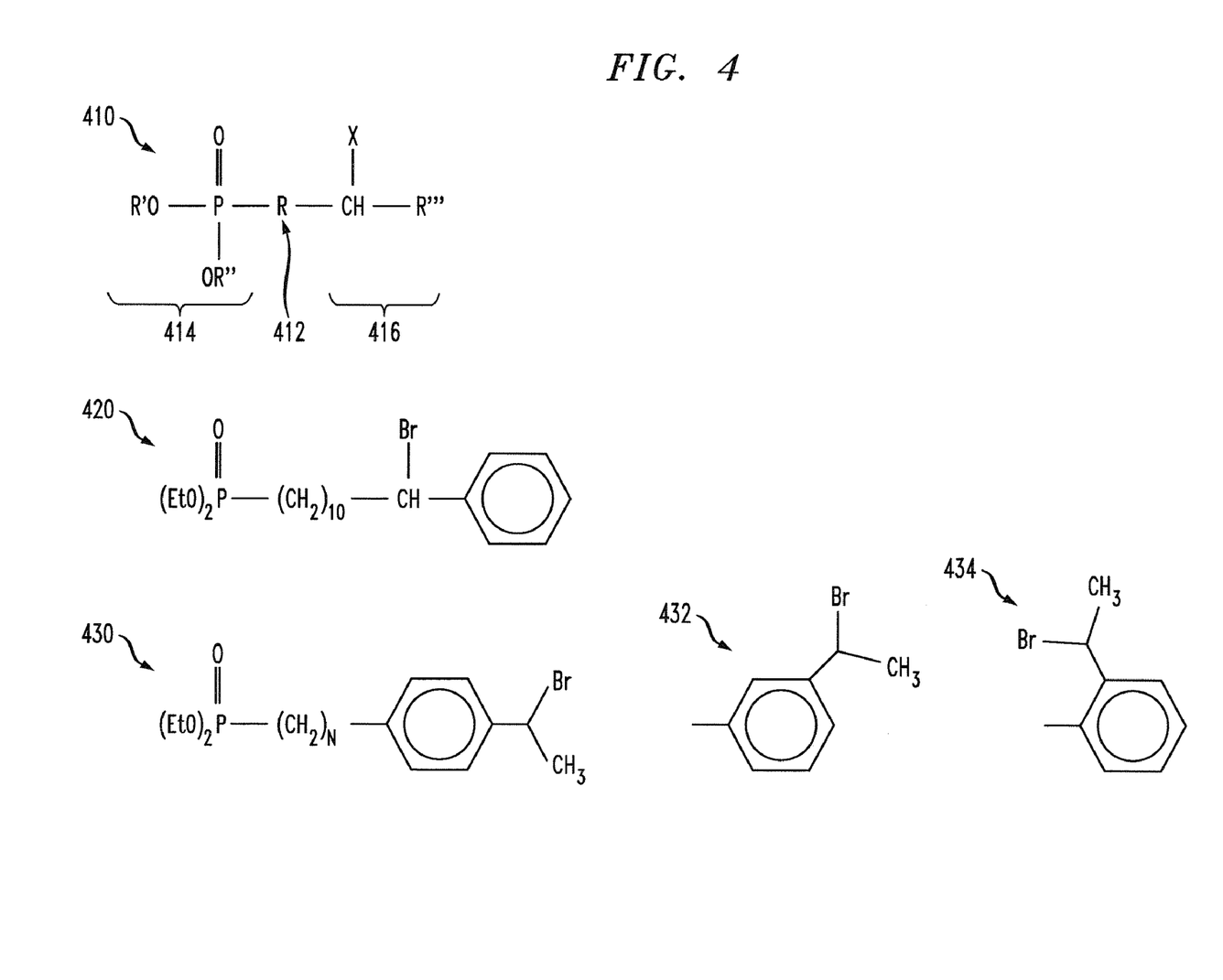
FIG. 4 illustrates an embodiment of an initiator.

An embodiment of the polymerization initiator 360 is illustrated in FIG. 4 generally as a composition 410. In one aspect, the composition 410 is described by three portions. A chain portion 412 is terminated at one end by a phosphonate group 414. The chain portion 412 is terminated at another end by an initiator portion 416.

The chain portion 412 is denoted generally as "R," and includes a chain of carbon atoms. As used herein, the term "chain" refers to a linear assembly of atoms joined by single or double bonds, and may additionally include side groups. In one aspect, the chain has sufficient freedom of motion to effectively screen one particle core 310 from polar interactions with other particle cores 310. It is believed that chain flexibility helps screen the surface 350 from interactions with other particle cores 310. This screening is believed to reduce aggregation of the particle cores 310.

In another aspect, R has few enough carbon atoms so that access to the surface by other polymerization initiators 360 is not significantly reduced. Thus, the surface 350 is effectively coated with a plurality of polymerization initiators 360. In an embodiment, R comprises a chain having six or more carbon atoms linked by single bonds. In another embodiment, the R comprises a chain having about 20 or fewer carbon atoms. It is believed that a chain having about 21 or more carbon atoms may reduce access to the surface 350 by additional polymerization initiators 360, reducing the density of polymerization initiators 360 coating the surface 350.

The chain may contain one or more double bonds if the aforementioned freedom of motion is not significantly restricted. The chain portion 412 may also include side groups having linear, cyclic, or branched portions if such side groups do not significantly reduce chain flexibility. The chain may also include substitutents such as halogens on the main chain or on side groups, if present.

In an embodiment, the chain portion 412 is a linear alkane chain having a plurality of methylene groups, such that the number of hydrogen atoms is twice the number of carbon atoms. Preferably, the chain has about ten carbon atoms linked by single bonds. In an embodiment, the chain portion 412 consists of ten methylene groups.

The phosphonate group 414 is shown generally having groups OR' and OR". Phosphonate groups are well understood to have the general form $C-PO(OR)_2$. In one aspect, R' and R" are alkanes. In some cases, R' and R" may be the same, while in other cases, they may be different. As discussed further below, R' and R" may also be portions of an inorganic compound. It is believed that the phosphonate group 414 serves to attach the polymerization initiator 360 to the surface 350. Phosphonates are known to bind strongly to the surface of inorganic compounds such as titanium dioxide and perovskites.

The initiator portion 416 may be a halogenated alkyl derivative. The initiator portion 416 is expected to act as an atomic transfer radical polymerization (ATRP) initiator. Those skilled in the chemical arts appreciate that an ATRP initiator may act to stabilize a carbon radical under certain conditions. In the presence of an active olefin, the ATRP initiator may then initiate formation of a polymer chain chemically bonded to the initiator.

The initiator portion 416 includes a halogen, generally denoted "X," and an aryl or other cyclic aromatic moiety R'''. In some embodiments, the halogen is bromine, though in others, chlorine or iodine may be used. The cyclic aromatic moiety may be any aromatic moiety capable of stabilizing the presence of a carbon radical when the halogen is removed. In some cases, R may be a phenyl group. In other cases, R may have multiple, fused rings, such as a naphthyl group, or may include a heterocyclic moiety, such as pyridine.

An embodiment conforming to the general characteristics set forth above is illustrated as initiator 420. In this embodiment, R' and R" are ethyl groups. The chain portion 412 includes ten methylene groups. The initiator portion 416 is an α-bromobenzyl moiety. Thus, the halogen is bromine, and the aromatic moiety R''' is a phenyl ring. Using conventional naming rules, initiator 420 is designated as 11-phenyl, 11-bromo, diethyl undecane phosphonate 420.

An alternate embodiment is illustrated as initiator 430. In this case, a phenyl ring is chemically bonded to the chain portion 412, and an α-bromo ethyl group is chemically bonded to the phenyl ring in the para position. It is believed that this embodiment may result in a more linear combination of the initiator 420 and the polymer chain 370, which may be preferable in some cases. In other alternate embodiments, the α-bromo ethyl group may be attached to the phenyl ring in the meta (432) and ortho (434) positions.

Figure 5:
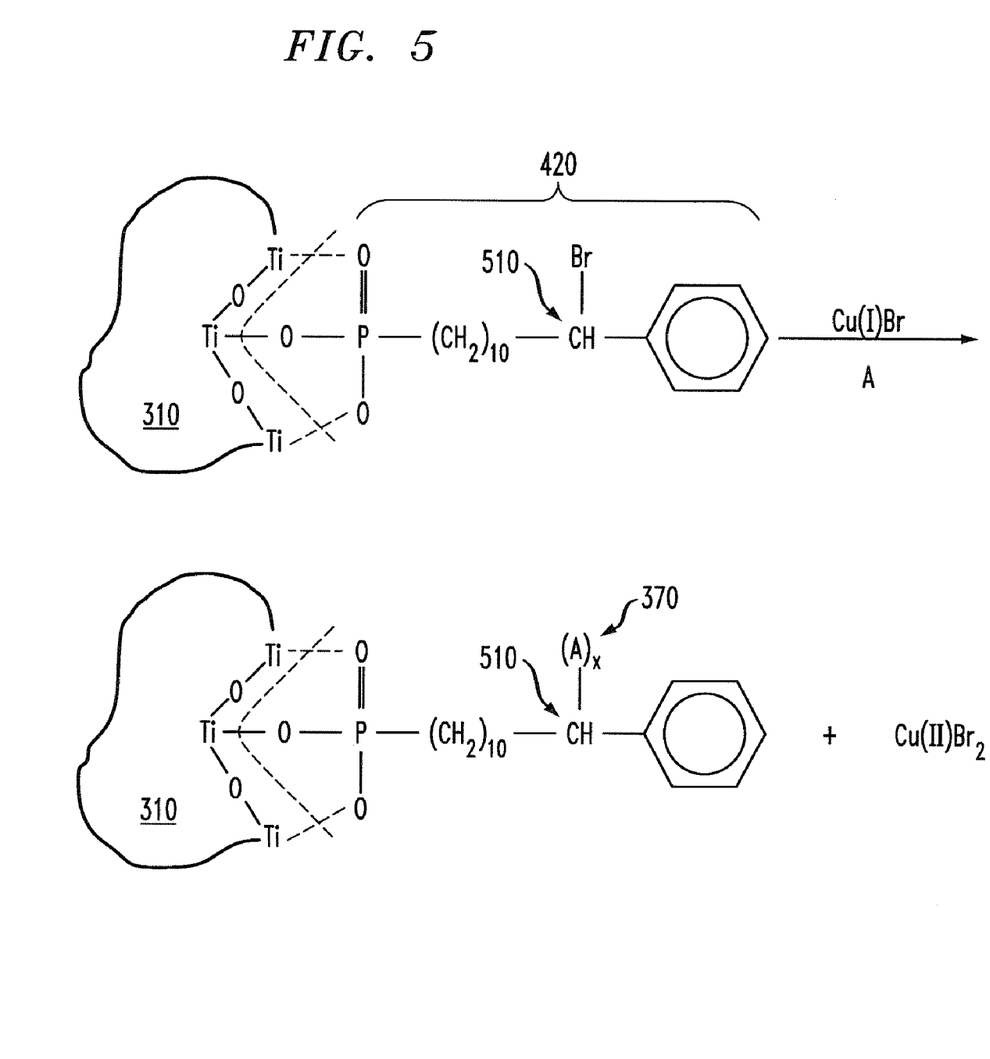
FIG. 5 illustrates bonding of a particle core to an initiator, and polymerization from the initiator.

FIG. 5 illustrates the chemical bonding of the polymerization initiator 360 to the particle core 310. In one aspect, the particle core 310 may be an inorganic nanoparticle. As used herein, the term "nanoparticle" refers to particles for which a maximum dimension is between about 10 nm and 250 nm, inclusive. In the illustrated embodiment, the polymerization initiator 360 is 11-phenyl, 11-bromo, diethyl undecane phosphonate 420, and the particle core 310 includes titania. In some cases, the particle core 310 may also include perovskite compounds, such as $BaTiO_3$ and $SrTiO_3$.

It is believed that the phosphonate group 414 chemically bonds to the surface of the titania particle with a combination of covalent bonding (solid line) and coordinate bonding (dashed lines). When the polymerization initiator 360 bonds to the particle core 310, it is believed that the alkoxy moieties are displaced in a ligand exchange reaction.

FIG. 5 also illustrates the formation of a polymer chain 370 attached to the polymerization initiator 360 at carbon atom 510. As is well understood in the chemical arts, when bromine is used as the halogen of the polymerization initiator 360, Cu(I)Br may be used to activate the polymerization initiator 360. It is believed that the copper atom reacts with the bromine atom attached to carbon atom 510, which results in the formation of Cu(II)Br$_2$ and a stabilized radical. The radical may then react with a monomer "A" present in solution through radical polymerization, forming a chain of multiple "A" units.

The monomer "A" may be an "active" olefin. An active olefin is one for which formation of a polymer chain through radical polymerization is energetically favorable. Numerous active olefins are known. Derivatives contemplated herein include those suitable for forming flexible and processable films of the composition 300. Two specific embodiments are described without limitation. In a first embodiment, the monomer is styrene:

Heterocyclic analogs of styrene, such as vinyl pyridine, may also be used. In a second embodiment, the monomer is a derivative of acrylic acid, with substitutents R' and R":

Numerous derivatives of acrylic acid are known. Examples include, without limitation, methyl methacrylate (R'=R"=CH$_3$) and butyl methacrylate (R'=C$_4$H$_9$, R"=CH$_3$).

Figure 6:
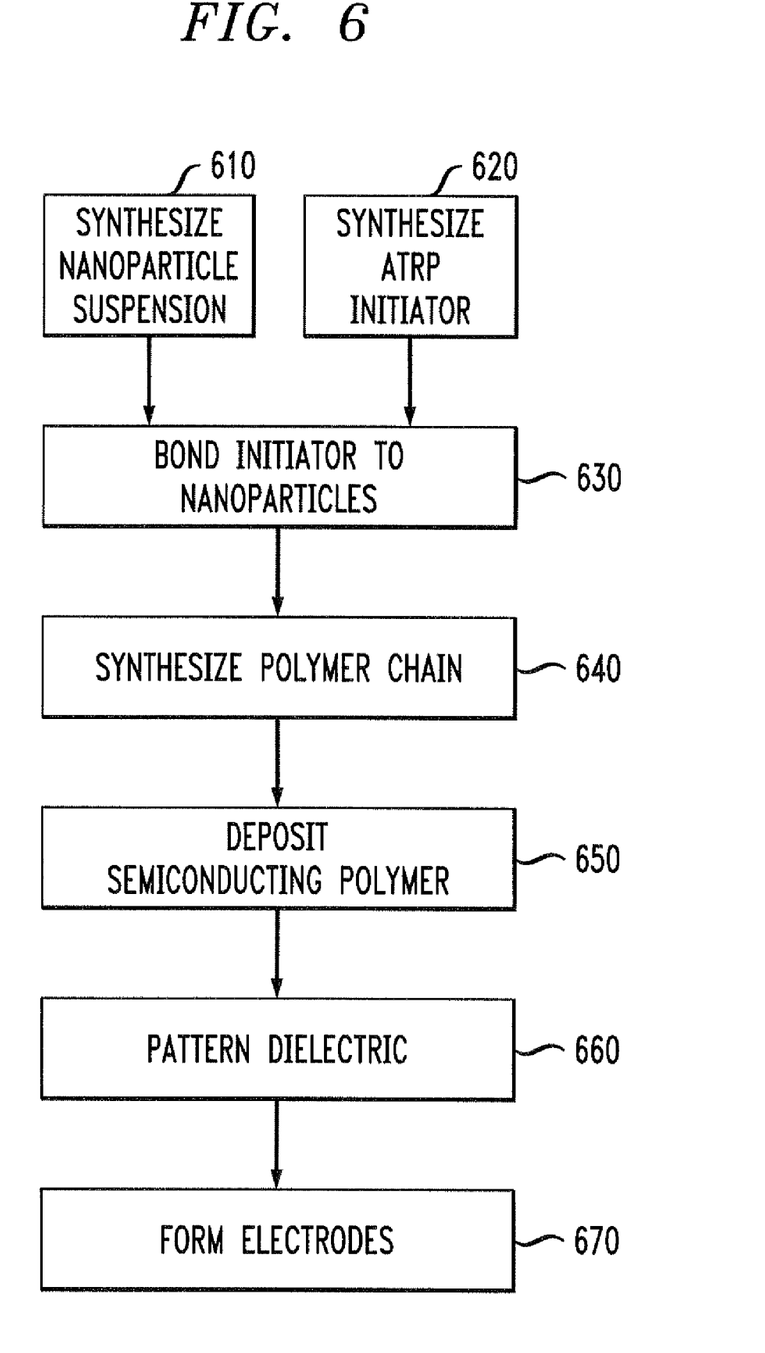
FIG. 6 illustrates a method of forming an apparatus.

FIG. 6 illustrates an embodiment of a method of forming the electronic device 110. In a step 610, a suspension of particle cores 310 is formed. The particle cores 310 are formed in a low-polarity solvent such as chlorobenzene in a manner that provides each particle core 310 with a coating of oleic acid to prevent agglomeration of the particle cores 310. Such methods of forming such a suspension of particle cores 310 such as TiO$_2$ and BaTiO$_3$ are well known to those skilled in the pertinent art. If desired, the particle cores 310 may be washed with methanol and concentrated by centrifugation.

In a step 620, the polymerization initiator 360 is formed. A method of forming 11-phenyl, 11-bromo diethyl undecane phosphonate 420, e.g., is presented in FIG. 7, while recognizing that other polymerization initiators 360 formed by different methods may be used.

Figure 7:
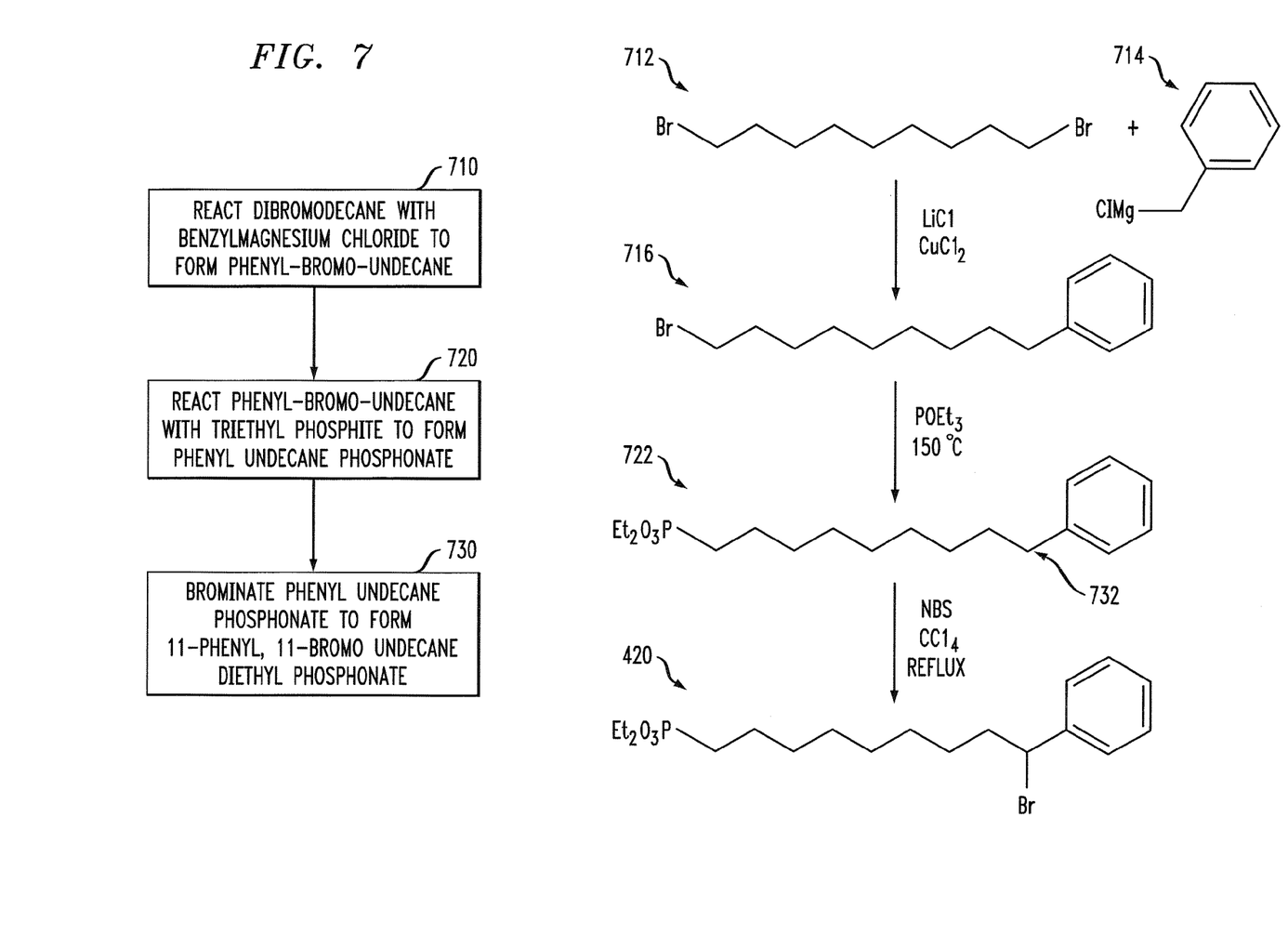
FIG. 7 illustrates a method of synthesizing an initiator.

The synthesis of the polymerization initiator 360 begins in a step 710, in which commercially available 1,10-dibromodecane 712 is reacted with benzylmagnesium chloride 714 in the presence of catalytic copper chloride and lithium chloride to produce a coupling product phenyl-bromo-undecane 716. In a step 720, the phenyl-bromo-undecane 716 is subjected to Arbuzov condensation with triethylphosphite at 150° C. to generate the phenyl-undecane phosphonate 722. In a step 730, the phenyl undecane phosphonate 722 is brominated at the alpha position 732 using N-bromosuccinide (NBS) and carbon tetrachloride to generate the 11-phenyl, 11-bromo undecane diethyl phosphonate 420.

In a step 630, the polymerization initiator 360 is bonded to the particle core 310. Bonding may be accomplished, e.g., by mixing the polymerization initiator 360 with the suspension of particle cores 310 formed previously under appropriate conditions. In one aspect, the polymerization initiator 360 may be mixed with the particle cores 310 in chlorobenzene and heated to 100° C. for 24 hours to effect the ligand exchange reaction described previously to bind the polymerization initiator 360 to the surface 350. The initiator-coated particle cores 310 may be recovered by precipitation into methanol and centrifugation, followed by several methanol washes.

In a step 640, particles 330 are produced by forming polymer chains 370, attached to the polymerization initiator 360 as described previously. The molecular weight of the polymer chains 370 may be controlled by methods well known in the chemical arts. By controlling the molecular weight, the concentration of particle core 310 material in the composition 300 may be adjusted. Because the dielectric constant of the composition 300 is expected to be approximately the weighted average of the dielectric constants of the polymer shell 320 and the particle core 310, control of the molecular weight provides a means to adjust the dielectric constant of the composition 300.

In a step 650, a solution of the particles 330 is formed by mixing a quantity of the particles 330 with a solvent in which the polymer chains 370 are at least partially soluble. The solvent is also chosen to be compatible with the method to be used to form a film of the particles 330. For example, when the polymer chains are polystyrene, a chlorinated solvent such as, e.g., chlorobenzene may be used. The concentration of particles 330 is chosen to produce a desired viscosity of the resulting solution, and may be different for, e.g., spin-coating and jet-printing. After forming the solution, the dielectric layer 220 is formed using the desired technique, for which appropriate process parameters may be determined by those skilled in the pertinent art.

In a step 660, the dielectric layer 220 is patterned if necessary. It will be appreciated that when ink jet printing or other printing methods are used, it may not be necessary to pattern the dielectric layer 220. If patterning is desired, conventional techniques such as selective removal by plasma etch or lift-off may be used.

In a step 670, the layer 230, and electrodes 240, 250 and 260 are formed by conventional methods. The electronic device 110 may then be coupled to power and control electronics to produce the apparatus 100.

Although the present invention has been described in detail, those skilled in the pertinent art should understand that they can make various changes, substitutions and alterations herein without departing from the spirit and scope of the invention in its broadest form.

What is claimed is:

1. An apparatus, comprising:
   a substrate having a surface; and
   a dielectric layer comprising a polymer medium and a distribution of particle cores within the medium, the dielectric layer being located over said surface and having a dielectric constant of seven or more,
   wherein each one of the particle cores comprises TiO$_2$ and has a polymer shell comprising a polymer chain chemically bonded thereto via a phosphonate moiety
   wherein said polymer medium is formed from the polymer shells, and said polymer chain is selected from the group consisting of
   styrene;
   vinyl pyridine;
   methyl methacrylate; and
   butyl methacrylate.

2. The apparatus as recited in claim 1, wherein aggregates of said particle cores, the aggregates having diameters of about 0.5 μm or more, are substantially absent from said distribution of particle cores.

3. The apparatus as recited in claim 1, wherein said dielectric layer is a gate dielectric of a FET.

4. The apparatus of claim 1, wherein said polymer chain is bonded to said phosphonate moiety via a linear methylene chain having between 6 and 20 carbon atoms.

5. The apparatus of claim 1, wherein said polymer chain is further bonded to said particle core via a linear methylene chain having between 6 and 20 carbon atoms.

6. An apparatus, comprising:
   a substrate having a surface; and
   a dielectric layer comprising a polymer medium and a distribution of particle cores within the polymer medium, the dielectric layer being located over said surface and having a dielectric constant of seven or more,
   wherein each one of the particle cores has a polymer shell chemically bonded thereto and located around the one of the particle cores, each particle core comprising a material having a dielectric constant of about fifteen or more, and
   wherein said polymer medium is formed from the polymer shells and the polymer shells comprise a linear methylene chain having between 6 and 20 carbon atoms and a polymer chain connected to the methylene chain.

7. The apparatus as recited in claim 6, wherein said particle cores comprise a material having a dielectric constant of about thirty or more.

8. The apparatus as recited in claim 6, wherein said particle cores comprise titania or a perovskite.

9. The apparatus of claim 6, wherein the polymer chain and an aryl moiety are bonded to a same carbon atom of said methylene chain.

10. The apparatus of claim 6, wherein said polymer chain is formed from a monomer selected from the group consisting of:
    styrene;
    vinyl pyridine;
    methyl methacrylate; and
    butyl methacrylate.

11. The apparatus of claim 6, wherein said polymer shell is bonded to the associated particle core by a phosphonate moiety.

12. The apparatus of claim 5, wherein said methylene chain is bonded to said particle core by said phosphonate moiety.

13. The apparatus of claim 5, wherein said poly(methyl methacrylate) chain and an aryl moiety are bonded to a same carbon atom of said methylene chain.

14. The apparatus as recited in claim 6, wherein said particle cores comprise titania or a perovskite.

15. The apparatus as recited in claim 6, wherein said dielectric layer is a gate dielectric of a FET.

16. The apparatus of claim 5, wherein the polymer chain and an aryl moiety are bonded to a same carbon atom of said methylene chain.

* * * * *